(12) United States Patent
Hwang

(10) Patent No.: US 7,541,675 B2
(45) Date of Patent: Jun. 2, 2009

(54) SEMICONDUCTOR DEVICE INCLUDING FLUORINE DIFFUSION BARRIER LAYER AND METHOD FOR MANUFACTURING THE SAME

(75) Inventor: Jong-Taek Hwang, Chungcheongbuk-do (KR)

(73) Assignee: Dongbu HiTek Co., Ltd., Seoul (KR)

( * ) Notice: Subject to any disclaimer, the term of this patent is extended or adjusted under 35 U.S.C. 154(b) by 0 days.

(21) Appl. No.: 11/844,618

(22) Filed: Aug. 24, 2007

(65) Prior Publication Data

US 2008/0054465 A1    Mar. 6, 2008

(30) Foreign Application Priority Data

Aug. 30, 2006   (KR) .................. 10-2006-0082737

(51) Int. Cl.
*H01L 23/48* (2006.01)
(52) U.S. Cl. ...................................... 257/751; 438/627
(58) Field of Classification Search ................. 257/751; 438/627
See application file for complete search history.

(56) References Cited

U.S. PATENT DOCUMENTS 6,764,940 B1 *   7/2004  Rozbicki et al. ............ 438/627
2007/0128860 A1 *   6/2007  Hou et al. .................... 438/680

FOREIGN PATENT DOCUMENTS

KR    1020030001937 A    1/2003
KR    1020040049801 A    6/2004

* cited by examiner

*Primary Examiner*—Douglas M Menz
(74) *Attorney, Agent, or Firm*—Sherr & Vaughn, PLLC

(57) ABSTRACT

A semiconductor device including a fluorine diffusion barrier layer and a method for manufacturing the same are provided. The semiconductor device includes a specific pattern formed over a semiconductor substrate, a fluorine diffusion barrier layer formed over the specific pattern, and an interlayer insulating layer containing fluorine formed over the fluorine diffusion barrier layer. The fluorine diffusion barrier layer may be used to essentially prevent fluorine from being diffused into a specific pattern formed of a metal or tetra-ethyl-orthosilicate (TEOS) layer and thus to prevent corrosion and void formation that might otherwise be caused by HF.

12 Claims, 5 Drawing Sheets

SEMICONDUCTOR DEVICE INCLUDING FLUORINE DIFFUSION BARRIER LAYER AND METHOD FOR MANUFACTURING THE SAME

The present application claims priority under 35 U.S.C. 119 to Korean Patent Application No. 10-2006-0082737, filed on Aug. 30, 2006, which is hereby incorporated by reference in its entirety.

BACKGROUND

When metal wirings of semiconductors are formed, an electrical insulating material (for example, silicon oxide) is filled between the metal wirings to provide electrical insulation between the electrical paths formed by the metal wirings.

Fluorine-doped silicon oxide is characterized by reducing signal delay, compared to other silicon oxides without fluorine. Fluorine-doped silicon oxide has a lower dielectric constant (k) than other silicon oxides, and may be used as an interlayer insulating material in devices with small design rules. However, since fluorine has high diffusivity, fluorine in the silicon oxide layer may react with an OH radical included in tetra-ethyl-ortho-silicate (TEOS)-based oxide in a capping layer formed under metal wirings, thereby forming highly corrosive HF. HF may create undesirable bubbles or corrode metal. When HF is used to form a specific pattern, fluorine atoms in the HF may react with an OH radical included in the TEOS-based oxide to form strong HF, again creating bubbles and corroding metal.

Figure 1A:
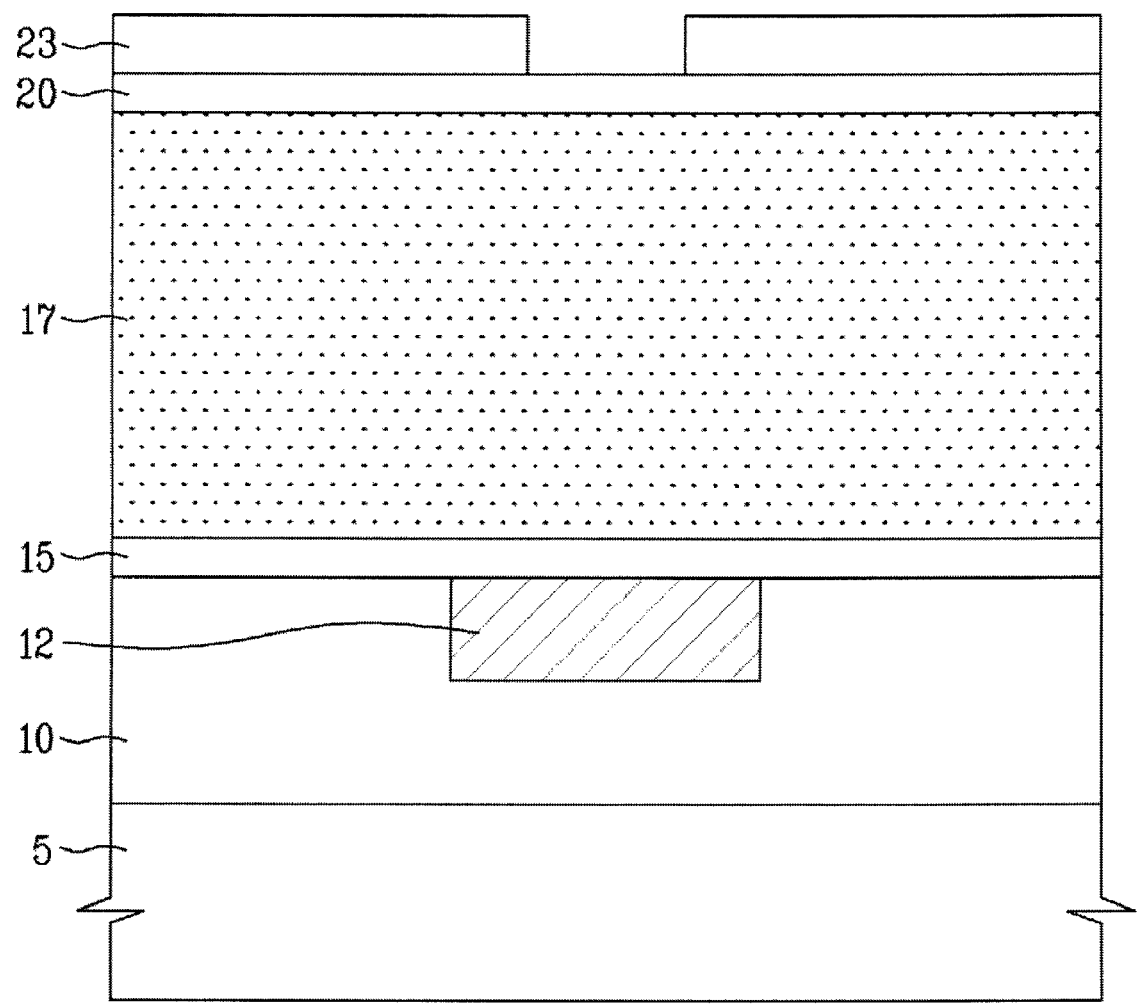
Figure 1B:
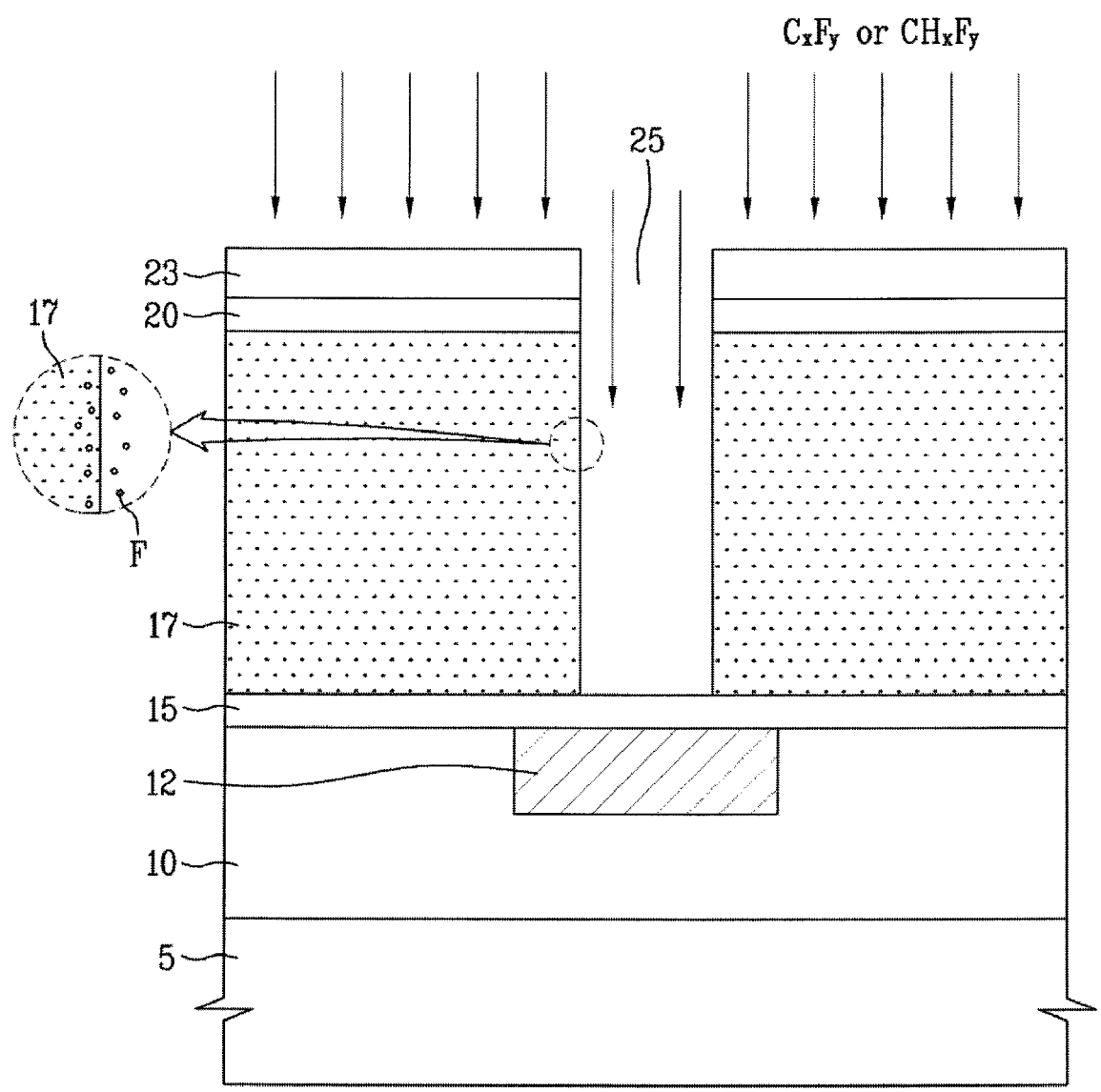
Figure 1C:
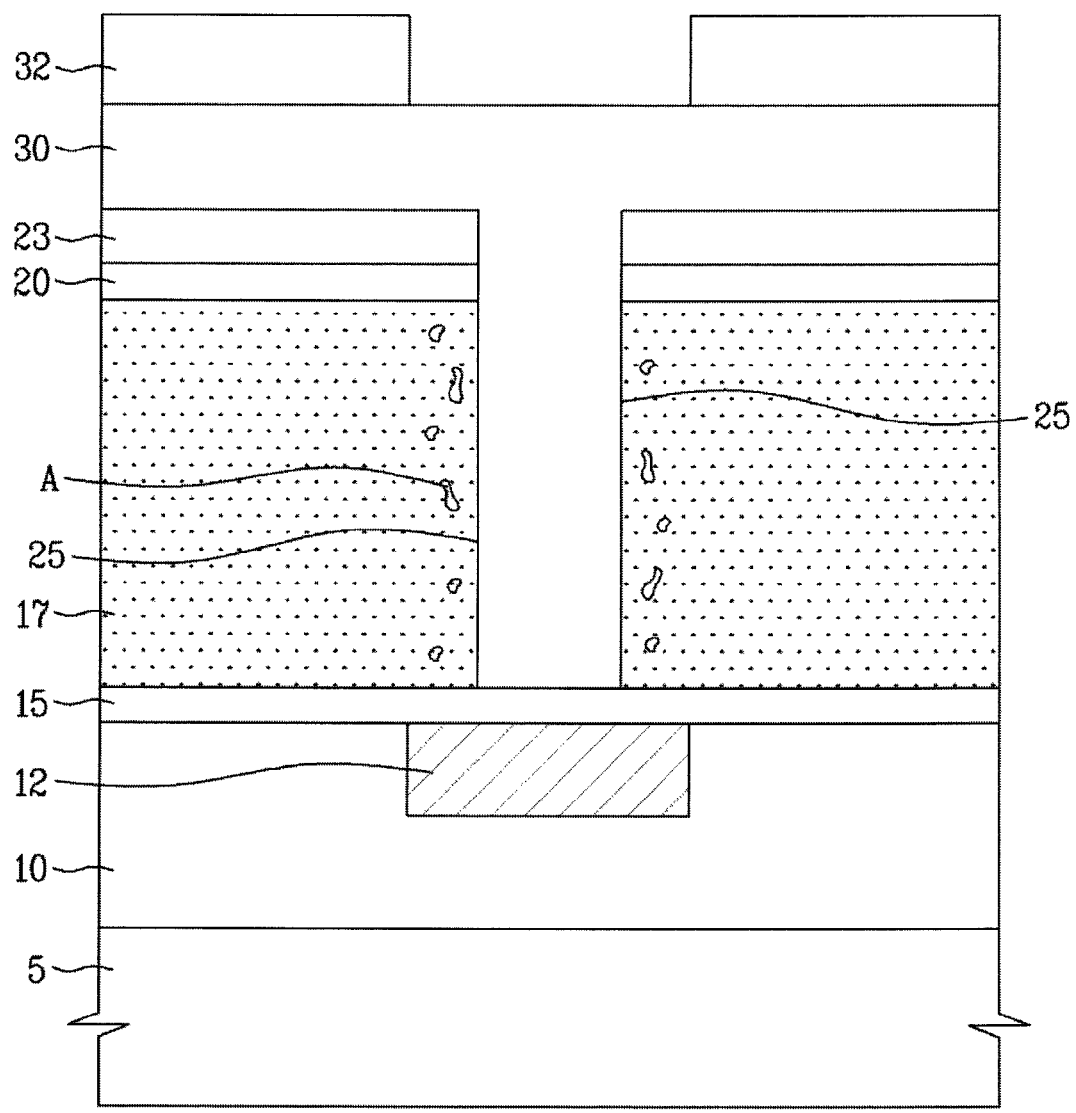

Reference will now be made in detail to FIGS. 1A to 1C which are sectional views illustrating a method for manufacturing a semiconductor device.

A lower insulating layer 10 is formed over a semiconductor substrate 5 and a lower wiring 12 is formed over the lower insulating layer 10. An etch stop layer 15 and a low-k dielectric layer 17 are sequentially formed over the lower insulating layer 10 including the lower wiring 12. The etch stop layer 15 is formed of a silicon nitride layer and the low-k dielectric layer 17 may be formed of a single silicon oxide layer containing fluorine, for example a fluorine-doped SiOF layer, to improve the operating speed of the semiconductor device. A protective capping layer 20 is formed over the low-k dielectric layer 17 since subsequent processes may damage the low-k dielectric layer 17 and degrade its characteristics.

The capping layer 20 may be formed of a tetra-ethyl-ortho-silicate (TEOS) layer. A mask layer is formed over the capping layer 20 and is then patterned to form a mask pattern 23. The mask pattern 23 may be formed of a photoresist layer.

As shown in FIG. 1B, the capping layer 20 and the low-k dielectric layer 17 are sequentially dry-etched using the mask pattern 23 as an etch mask. This dry etching forms a preliminary via hole 25 through which the etch stop layer 15 over the lower wiring 12 is exposed. Gas containing fluorine atoms (e.g. CxFy and/or CHxFy) is used for dry etching. Fluorine atoms may enter the low-k dielectric layer 17 from the gas etchant since the low-k dielectric layer 17 has a porous, spongy structure.

As shown in FIG. 1C, a sacrifice layer 30 is formed over the semiconductor substrate, filling in preliminary via hole 25. A photoresist pattern 32 is then formed over the sacrifice layer 30. The sacrifice layer 30 is has a high wet etching selection ratio to the low-k dielectric layer 17. The sacrifice layer 30 is formed to prevent the profile of the preliminary via hole 25 from being deformed in subsequent processes. The sacrifice layer 30 may be formed of an organosiloxane or hydro-silsesquioxane (HSQ) layer containing hydrogen. H or $H_2O$ may enter the low-k dielectric layer 17 during the process of forming the sacrifice layer 30.

Hydrogen atoms may react with fluorine atoms that are already present in the low-k dielectric layer 17 during the dry etching or fluorine atoms in the low-k dielectric layer 17 may be diffused into the capping layer 20 and then react with an OH radical in the capping layer 20 to form HF. The silicon oxide-based low-k dielectric layer 17 may be dissolved by this HF to cause a void "A" or may be diffused into the lower wiring 12 to corrode the lower wiring 12.

SUMMARY

Embodiments relate to a semiconductor device including a fluorine diffusion barrier layer which impedes or prevents diffusion of fluorine into a specific pattern. Embodiments relate to a method for manufacturing the semiconductor device. Embodiments relate to a semiconductor device which includes a nitride-doped fluorine diffusion barrier layer to impede diffusion of fluorine into a specific pattern for preventing the formation of corrosion and void formation. Embodiments relate to a method for manufacturing the semiconductor device.

According to embodiments, a semiconductor device may include a specific pattern formed over a semiconductor substrate. A nitride-doped fluorine diffusion barrier layer may be formed over the specific pattern. An interlayer insulating layer containing fluorine may be formed over the fluorine diffusion barrier layer.

The nitride-doped fluorine diffusion barrier layer may include a SiN or SiON layer in which N has been doped at a dose between approximately $5 \times 10^{13}$ and approximately $5 \times 10^{14}$ atoms/cm$^2$. The nitride-doped fluorine diffusion barrier layer may have a thickness of between approximately 250 Å and approximately 350 Å.

The specific pattern may be a metal pattern formed of Al or W or a copper pattern formed through a damascene process. The specific pattern may be formed of a tetra-ethyl-ortho-silicate (TEOS) layer.

In embodiments, a method for manufacturing a semiconductor device includes forming a specific pattern over a semiconductor device. A nitride-doped fluorine diffusion barrier layer may be formed over the specific pattern. An interlayer insulating layer containing fluorine may be formed over the nitride-doped fluorine diffusion barrier layer.

DRAWINGS

FIGS. 1A to 1C are sectional views illustrating a related method for manufacturing a semiconductor device.

Example FIGS. 2A to 2D are sectional views illustrating a procedure for forming a semiconductor device including a fluorine diffusion barrier layer, according to embodiments.

DESCRIPTION

Example FIGS. 2A to 2D are sectional views illustrating a procedure for forming a semiconductor device including a fluorine diffusion barrier layer according to embodiments. To provide a better understanding and a clear explanation of the procedure for forming a semiconductor device including a fluorine diffusion barrier layer according to embodiments, the following describes a fluorine diffusion barrier layer formed using a simplified pattern.

Figure 2A:
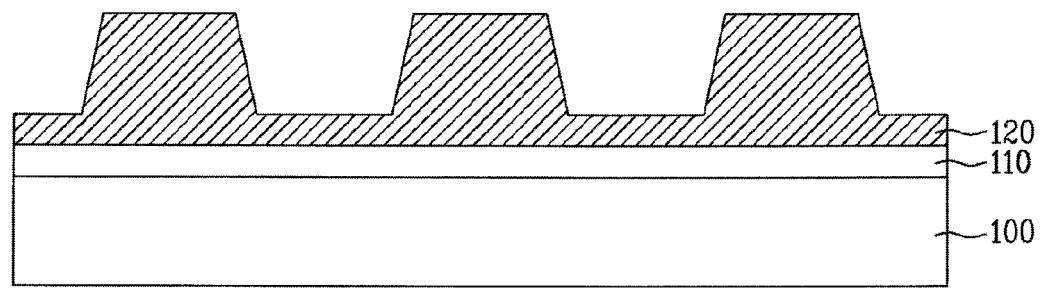

As shown in example FIG. 2A, an insulating layer 110 and a metal pattern 120 (e.g. aluminum (Al) and tungsten (W))

may be formed over a semiconductor substrate 100. The insulating layer 110 may be formed of $SiO_2$ and the metal pattern 120 may be formed through a metallization process. A copper pattern may be formed through a damascene process. A tetra-ethyl-ortho-silicate (TEOS) layer pattern may be formed instead of the metal pattern 120.

Figure 2B:
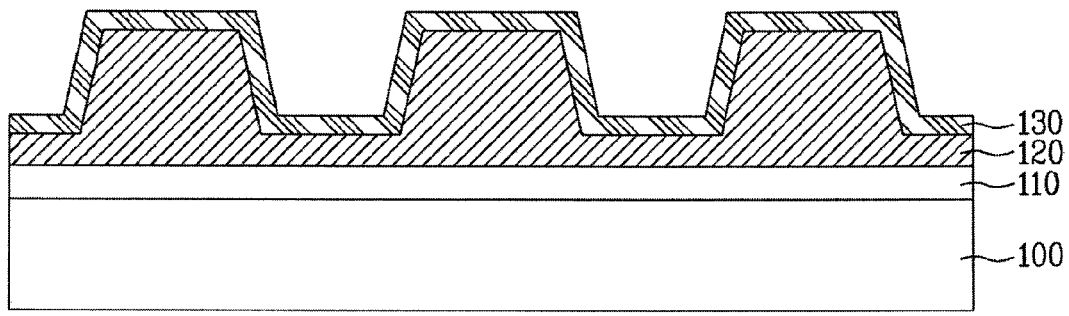
Figure 2C:
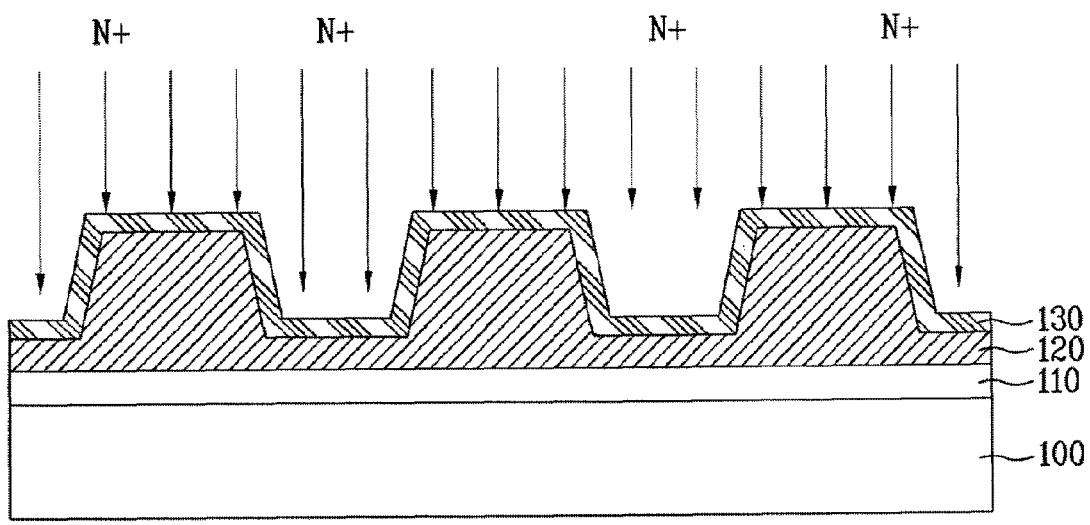
Figure 2D:
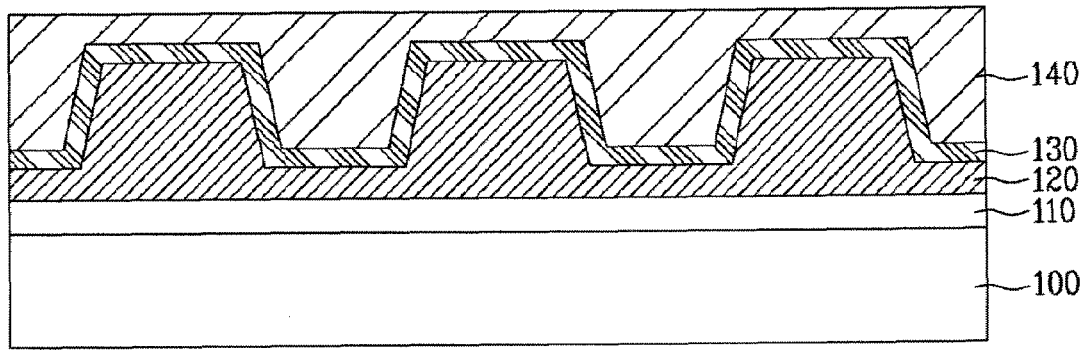

After the metal pattern 120 is formed, a fluorine diffusion barrier layer 130 for preventing diffusion of fluorine may be formed with a thickness between approximately 250 Å and approximately 350 Å over the metal pattern 120, as shown in example FIG. 2B. The fluorine diffusion barrier layer 130 may include a silicon nitride layer or a silicon oxynitride layer that has excellent hardness characteristics and a high interatomic bond strength.

Since the fluorine diffusion barrier layer 130 may have a relatively high dielectric constant (k) (e.g. a dielectric constant of approximately 4.7), the fluorine diffusion barrier layer 130 may cause serious signal delays. Therefore, as shown in example FIG. 2C, N doping is performed on the fluorine diffusion barrier layer 130 using an ion implantation process.

The N doping may be performed, for example, by implanting N+ ions at a dose between approximately $5 \times 10^{13}$ and approximately $5 \times 10^{14}$ atoms/cm² using an energy between approximately 5 and approximately 100 KeV. N doping inserts N into the bond of Si and N in the fluorine diffusion barrier layer 130 to break the bond, thereby making the crystalline structure looser, and thereby reducing the dielectric constant (k). The fluorine diffusion barrier layer 130 may prevent diffusion of fluorine into the metal pattern 120 since the inherent hardness of the SiN or SiNO layer may be maintained even though the N doping has been performed.

As shown in FIG. example 2D, an oxide layer 140 containing fluorine (e.g. a SiOF layer) is formed as an interlayer insulating layer over the fluorine diffusion barrier layer 130. SiOF may be deposited to cover the fluorine diffusion barrier layer 130 and the metal pattern 120.

Accordingly, the fluorine diffusion barrier layer 130 prevents fluorine contained in the oxide layer 140 from being diffused into the metal pattern 120 and also prevents fluorine contained in the oxide layer 140 from being diffused into a pattern formed of a TEOS layer other than the metal pattern 120. Fluorine diffusion barrier layer 130 essentially prevents the fluorine from reacting with an OH radical in the TEOS layer to form HF.

Embodiments relate to a semiconductor device including a fluorine diffusion barrier layer and a method for manufacturing the same. A fluorine diffusion barrier layer essentially prevents fluorine from being diffused into a specific pattern formed of a metal or tetra-ethyl-ortho-silicate (TEOS) layer. The diffusion barrier layer may prevent corrosion and void formation that might otherwise be caused by HF, thereby improving the reliability of the semiconductor device.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. An apparatus comprising:
   a specific pattern formed over a semiconductor substrate;
   a fluorine diffusion barrier layer comprising at least one of SiN and SiON layer formed over the specific pattern; and
   an interlayer insulating layer containing fluorine formed over the fluorine diffusion barrier layer,
   wherein the fluorine diffusion barrier layer is doped by nitrogen ions.

2. The apparatus of claim 1, wherein N has been implanted at a dose between approximately $5 \times 10^{13}$ atoms/cm² and approximately $5 \times 10^{14}$ atoms/cm².

3. The apparatus of claim 1, wherein the fluorine diffusion barrier layer has a thickness of between approximately 250 Å and approximately 350 Å.

4. The apparatus of claim 1, wherein the specific pattern is a metal pattern comprising at least one of Al and W.

5. The apparatus of claim 1, wherein the specific pattern is a copper pattern formed through a damascene process.

6. The apparatus of claim 1, wherein the specific pattern is formed of a tetra-ethyl-ortho-silicate (TEOS) layer.

7. A method comprising:
   forming a specific pattern over a semiconductor device;
   forming a fluorine diffusion barrier layer comprising at least one of a SiN and a SiON layer over the specific pattern;
   performing an ion implantation process doping nitrogen ions into the fluorine diffusion layer; and
   forming an interlayer insulating layer containing fluorine over the fluorine diffusion barrier layer.

8. The method of claim 7, wherein the step of forming the fluorine diffusion barrier layer comprises forming the at least one of a SiN and a SiON layer to a thickness of between approximately 250 Å and approximately 350 Å.

9. The method of claim 7, wherein the step of performing an ion implantation process comprises implanting N+ ions into the SiN or SiON layer at a dose between approximately $5 \times 10^{13}$ atoms/cm² and approximately $5 \times 10^{14}$ atoms/cm² using energy between approximately 5 KeV and approximately 100 KeV.

10. The method of claim 7, wherein the specific pattern is a metal pattern comprises at least one of Al and W.

11. The method of claim 7, wherein the specific pattern is a copper pattern formed through a damascene process.

12. The method according to claim 7, wherein the specific pattern is formed of a tetra-ethyl-ortho-silicate (TEOS) layer.

* * * * *